(12) United States Patent
Kim et al.

(10) Patent No.: US 7,075,241 B2
(45) Date of Patent: Jul. 11, 2006

(54) CHASSIS BASE FOR PLASMA DISPLAY DEVICE

(75) Inventors: Sok-San Kim, Cheonan-si (KR); Se-Il Oh, Cheonan (KR)

(73) Assignee: Samsung SDI Co., Ltd., Suwon-si (KR)

( * ) Notice: Subject to any disclaimer, the term of this patent is extended or adjusted under 35 U.S.C. 154(b) by 101 days.

(21) Appl. No.: 10/811,949

(22) Filed: Mar. 30, 2004

(65) Prior Publication Data

US 2004/0195969 A1    Oct. 7, 2004

(30) Foreign Application Priority Data

Apr. 1, 2003    (KR) ............................ 2003-0020431

(51) Int. Cl.
*G09G 3/10*    (2006.01)
*H01J 17/16*    (2006.01)
(52) U.S. Cl. ..................................... 315/169.3; 313/634
(58) Field of Classification Search ............. 315/169.1, 315/169.3, 169.4; 313/582, 634; 361/688, 361/816, 800
See application file for complete search history.

(56) References Cited

U.S. PATENT DOCUMENTS

| 6,446,373 B1 * | 9/2002 | Weinreich ..................... 40/427 |
| 6,560,124 B1 * | 5/2003 | Irie et al. ..................... 361/816 |
| 6,597,113 B1 | 7/2003 | Nitta ........................... 313/581 |
| 6,628,074 B1 | 9/2003 | Saito et al. .................. 313/582 |
| 6,811,028 B1 * | 11/2004 | Kim et al. .................. 206/587 |
| 6,813,159 B1 * | 11/2004 | Irie et al. ..................... 361/752 |
| 6,847,415 B1 * | 1/2005 | Yoshimura et al. ........... 349/58 |
| 6,882,108 B1 * | 4/2005 | Kim et al. .................. 313/582 |

FOREIGN PATENT DOCUMENTS

KR    10-2003-0016498    1/2005

* cited by examiner

*Primary Examiner*—Don Wong
*Assistant Examiner*—Minh Dieu A
(74) *Attorney, Agent, or Firm*—Robert E. Bushnell, Esq.

(57) ABSTRACT

A plasma display device includes a chassis base that is substantially rectangular having long sides and short sides. A plasma display panel (PDP) is mounted to a panel attachment face of the chassis base, and at least one plasma display panel drive circuit board is mounted to a circuit attachment face of the chassis base. Long side reinforcing members are mounted on the circuit attachment face of the chassis base along a long side direction thereof, and short side reinforcing members mounted on the circuit attachment face of the chassis base along a short side direction thereof. At least one short side reinforcing member is made of a material having a higher rigidity than a material from which the chassis base is made.

21 Claims, 3 Drawing Sheets

CHASSIS BASE FOR PLASMA DISPLAY DEVICE

CLAIM OF PRIORITY

This application makes reference to and claims all benefits accruing under 35 U.S.C. §119 from an application for PLASMA DISPLAY DEVICE earlier filed in the Korean Intellectual Property Office on the 1st day of Apr. 2003 and there duly assigned Serial No. 2003-20431.

BACKGROUND OF THE INVENTION

1. Field of the Invention

The present invention relates to a chassis base for a plasma display device, and more particularly, a chassis base which is increased in rigidity and prevented from undergoing thermal deformation which damages a plasma display panel.

2. Description of the Related Art

A plasma display panel (PDP) is a display device in which ultraviolet rays generated by the discharge of gas excite phosphors to realize predetermined images. As a result of the high resolution possible with plasma display panels (even with large screen sizes), they are quickly becoming one of the most popular flat panel display configurations.

The plasma display panel is included in a plasma display device, being mounted on a front surface of a chassis base inside the plasma display device. Also, a thermal conduction medium is interposed between and secured to a rear surface of the plasma display panel and the front surface of the chassis base. Plasma display panel drive circuit boards are mounted to a rear surface of the chassis base opposite the front surface to which the plasma display panel is mounted.

To enclose all these elements, a front case is positioned adjacent to a front surface of the plasma display panel opposite the rear surface of the plasma display panel, and a back case is positioned over the plasma display panel drive circuit boards mounted on the rear surface of the chassis base. The plasma display device may be wall-mounted or may be structured to stand on its own for placement on the floor, on a stand, in a case, etc.

In the plasma display device structured as described above, the chassis base on which that plasma display panel, thermal conduction medium and the drive circuit boards are mounted operates to receive heat generated by these elements during operation to expel the heat outside of the device through the back case. To allow for such an operation, the chassis base is formed of aluminum, which is a good conductor of heat.

SUMMARY OF THE INVENTION

In one exemplary embodiment of the present invention, there is provided a plasma display device that both enhances the rigidity of a chassis base and prevents thermal deformation of the same.

In an exemplary embodiment of the present invention, a plasma display device includes a chassis base that is substantially rectangular having long sides and short sides. A plasma display panel (PDP) is mounted to a panel attachment face of the chassis base, and at least one plasma display panel drive circuit board is mounted to a circuit attachment face of the chassis base. Long side reinforcing members are mounted on the circuit attachment face of the chassis base along a long side direction thereof, and short side reinforcing members mounted on the circuit attachment face of the chassis base along a short side direction thereof. At least one short side reinforcing member is made of a material having a higher rigidity than a material from which the chassis base is made.

The long side reinforcing members include a pair of first outer reinforcing members, each provided along one long side edge of the chassis base, a pair of first inner reinforcing members, each provided inwardly a predetermined distance from one of the first outer reinforcing members, and a middle reinforcing member provided between the two first inner reinforcing members.

The short side reinforcing members include a pair of second outer reinforcing members, each provided along one short side edge of the chassis base, and a pair of second inner reinforcing members, each provided inwardly a predetermined distance from one of the second outer reinforcing members. At least one short side reinforcing member is made of a material having a higher rigidity than the material of the chassis base.

The second inner reinforcing members may be made of a material having a higher rigidity than the material of the chassis base, and the middle reinforcing member may also be made of a material having a rigidity that is greater than the rigidity of the material of the chassis base. Preferably, the chassis base is made of aluminum and these elements are made of steel, which has a rigidity that is twice or more the rigidity of aluminum. Also, the middle reinforcing member may be made of a material having the same rigidity as the material of the second inner reinforcing members.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Figure 1:
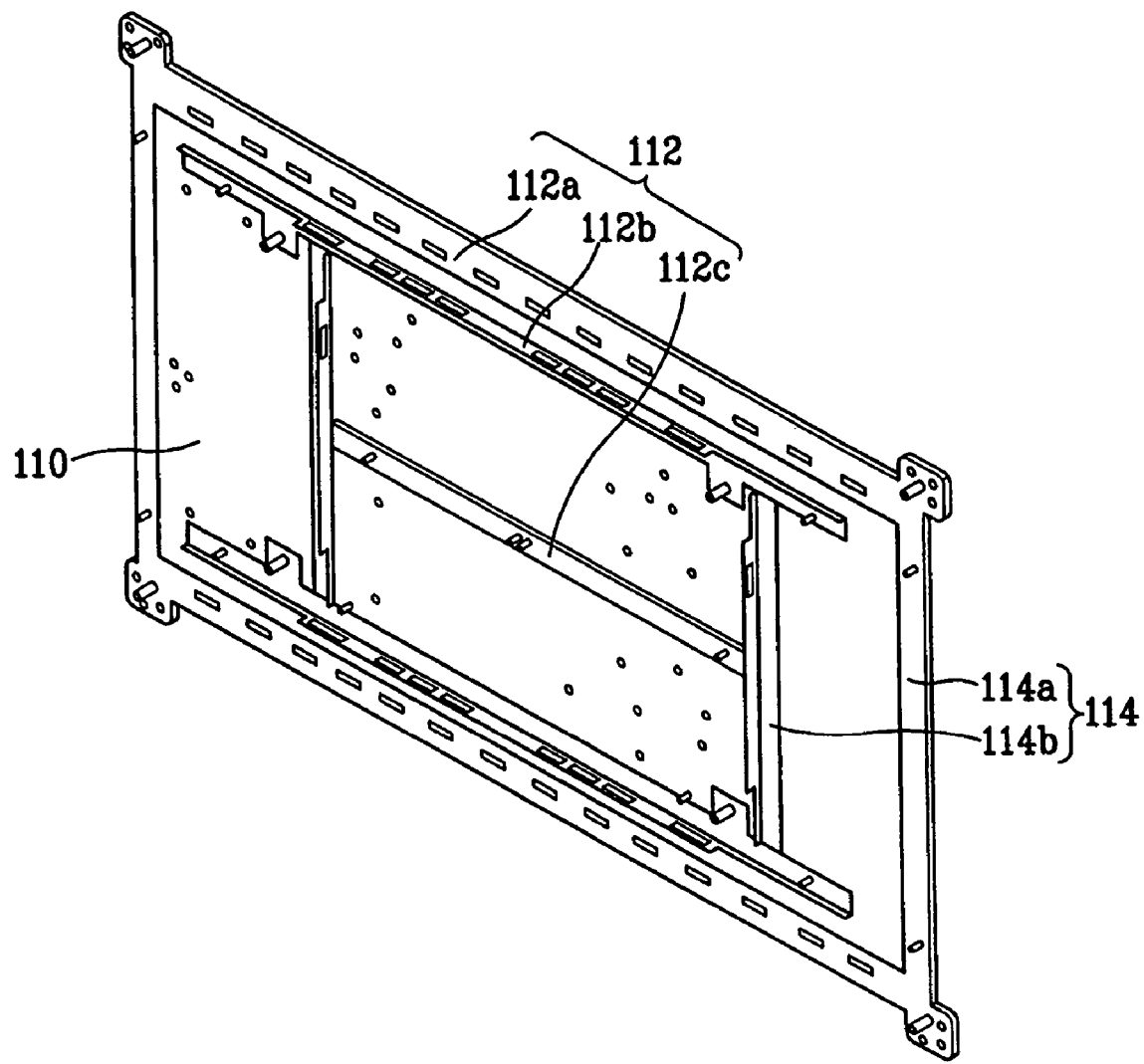
FIG. 1 is a perspective view of an exemplary chassis base.

Referring to FIG. 1, a chassis base 110 is substantially rectangular having long sides and short sides. To increase the rigidity of chassis base 110, there are mounted on chassis base 110 horizontal reinforcing members 112 for increasing the rigidity of chassis base 110 in the long side direction thereof, and vertical reinforcing members 114 for increasing the rigidity of chassis base 110 in the short side direction thereof.

Horizontal reinforcing members 112 include a pair of first outer reinforcing members 112a provided along long side edges of chassis base 110; a pair of first inner reinforcing members 112b, each provided inwardly a predetermined distance from one of the first outer reinforcing members 112a; and a middle reinforcing member 112c provided between the two first inner reinforcing members 112b. Vertical reinforcing members 114 include a pair of second outer reinforcing members 114a provided along short side edges of chassis base 110, and a pair of second inner reinforcing members 14b, each provided inwardly a predetermined distance from one of the second outer reinforcing members 114a.

Horizontal reinforcing members 112 and vertical reinforcing members 114 structured as described above are made of aluminum or steel. In the case where horizontal and vertical reinforcing members 112 and 114 are made of the same aluminum material as chassis base 110, for example, AL 5052 which has a CTE (coefficient of thermal expansion) of 23.8 μm/m° C. and a modulus of elasticity of 70 GPa (sample 1), horizontal and vertical reinforcing members 112 and 114 exhibit a thermal deformation of 0.1 mm and a bending rigidity of 124.8918N/mm as shown in Table 1 below.

Accordingly, deformation of chassis base 110 caused by differences in the thermal expansion coefficients of chassis base 110 and of horizontal and vertical reinforcing members 112 and 114 may be avoided. Such a choice of materials, however, results in limitations in increasing the rigidity of chassis base 110. This may cause chassis base 110 to become damaged as a result of external factors such as impacts given during packaging and transport, or stresses imposed upon chassis base 110 when the plasma display device is mounted on a wall.

TABLE 1

| Sample number | Thermal deformation (mm) | Bending rigidity (N/mm) |
| --- | --- | --- |
| Sample 1 | 0.1 | 124.8918 |
| Sample 2 | 9.5 | 166.2825 |

In the case where horizontal and vertical reinforcing members 112 and 114 are made of steel, for example, SECC steel which has a CTE of 12.6 μm/m° C. and a modulus of elasticity of 200 Gpa (sample 2), horizontal and vertical reinforcing members 112 and 114 exhibit a thermal deformation of 9.5 mm and a bending rigidity of 166.2825N/mm as shown in Table 1 above.

Therefore, although rigidity is improved compared to when using aluminum, the difference in thermal expansion coefficients between chassis base 110 and reinforcing members 112 and 114 is such that thermal deformation of chassis base 110 may occur as a result of variations in heat occurring during operation of the plasma display panel.

An preferred embodiment of the present invention will now be described in detail with reference to the FIG. 2.

Figure 2:
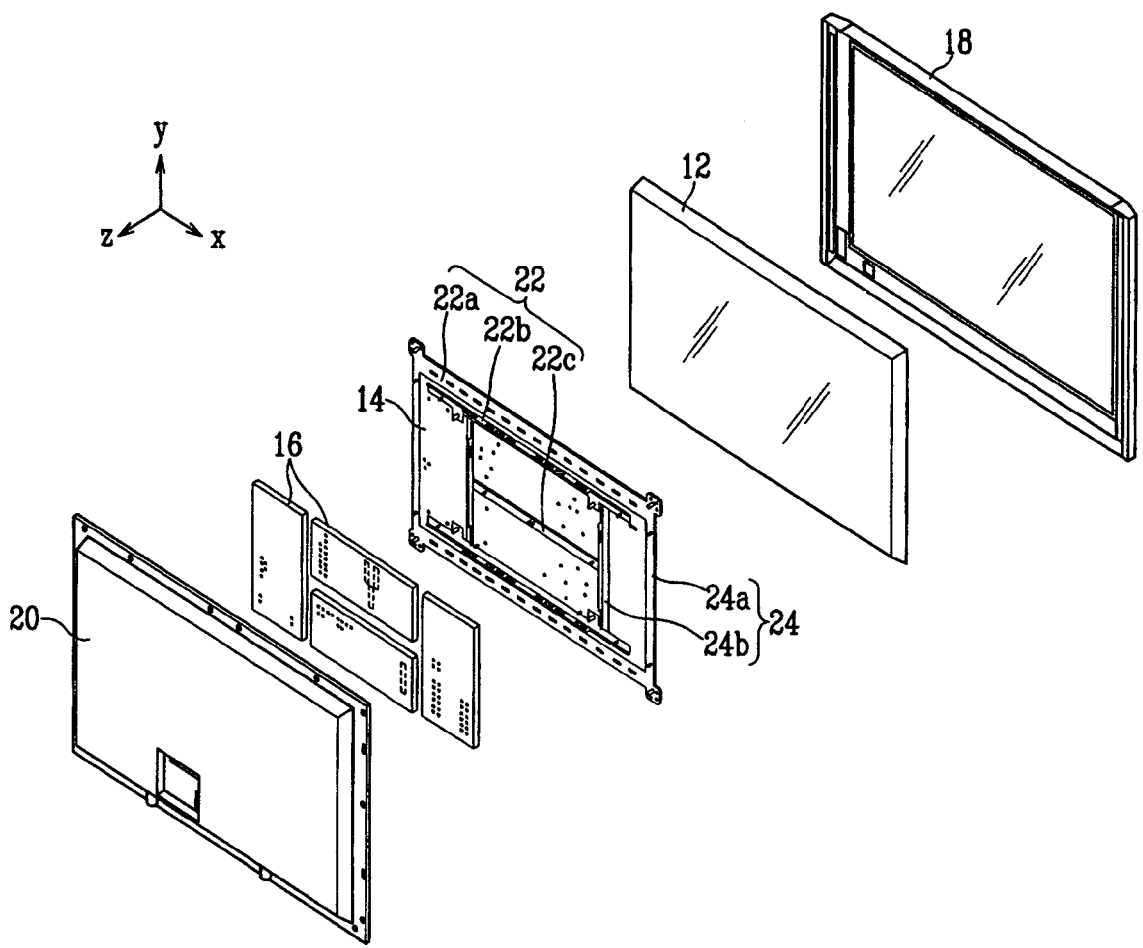
FIG. 2 is an exploded perspective view of a plasma display panel according to a preferred embodiment of the present invention.
Figure 3:
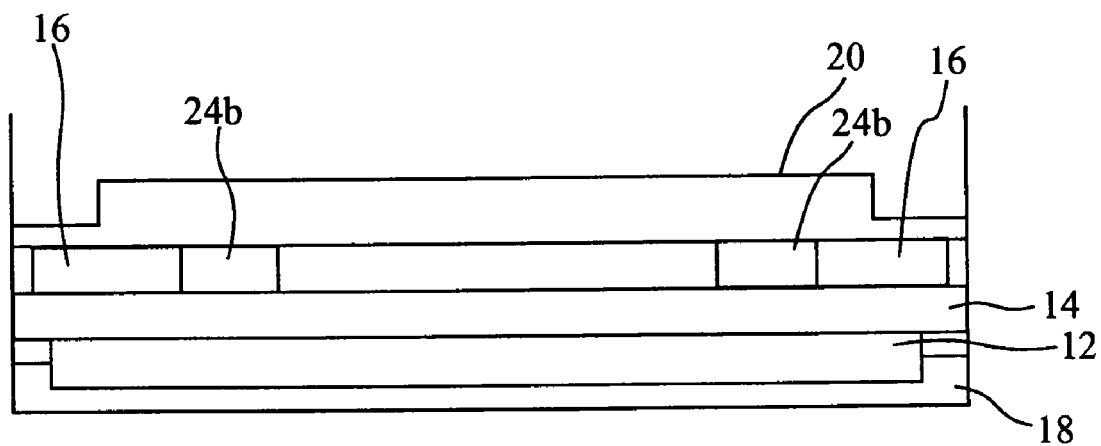
FIG. 3 is a cross-sectional view of the plasma display device of FIG. 2 in an assembled arrangement.

FIG. 2 is an exploded perspective view of a plasma display device according to an exemplary embodiment of the present invention. FIG. 3 is a cross-sectional view of the plasma display device of FIG. 2 in an assembled arrangement.

With reference to FIGS. 2 and 3, a plasma display device according to an exemplary embodiment of the present invention includes a front cover 18 and a rear cover 20 that define an exterior of the plasma display device when assembled. Mounted between front cover 18 and rear cover 20 are a plasma display panel (PDP) 12, a chassis base 14, and plasma display panel circuit boards 16. In more detail, plasma display panel 12 is mounted adjacent to front cover 18, plasma display panel circuit boards 16 are mounted adjacent to an inner (front) face of rear cover 20, and chassis base 14 is interposed between plasma display panel 12 and plasma display panel circuit boards 16.

Accordingly, a chassis base 14 that is substantially rectangular having long sides and short sides includes a panel attachment face to which plasma display panel (PDP) 12 is mounted, and a circuit panel attachment face to which at least one plasma display panel circuit board 16 is mounted.

Aluminum, which is highly thermally conductive, undergoes a forging press process to form chassis base 14. Chassis base 14 is formed into a substantially rectangular shape having long sides (horizontal sides) and short sides (vertical sides), and provided on a face of chassis base 14, adjacent plasma display panel circuit boards 16, are long side reinforcing members 22 and short side reinforcing members 24.

Long side reinforcing members 22 include a pair of first outer reinforcing members 22a, each provided along respective long side edges of chassis base 110; a pair of first inner reinforcing members 22b, each provided inwardly a predetermined distance from respective ones of first outer reinforcing members 22a; and a middle reinforcing member 22c provided between the two first inner reinforcing members 22b.

Short side reinforcing members 24 include a pair of second outer reinforcing members 24a, each provided along respective short side edges of the chassis base 110, and a pair of second inner reinforcing members 24b, each provided inwardly a predetermined distance from respective ones of second outer reinforcing members 24a.

Long side reinforcing members 22 and short side reinforcing members 24 are made of a mixture of materials. That is, some of the elements of reinforcing members 22 and 24 are made of a material having the same thermal deformation characteristics as chassis base 14, while the remaining elements of reinforcing members 22 and 24 are made of a material having a rigidity that is twice or more the rigidity of chassis base 14.

In particular, elements of long side reinforcing members 22 and short side reinforcing members 24 positioned where thermal deformation of the chassis base 14 is most likely to occur (i.e., first outer reinforcing members 22a, first inner reinforcing members 22b, and second outer reinforcing members 24a) are made of a material having the same or similar thermal deformation characteristics as the material from which chassis base 14 is made. For example, chassis base 14 and the elements of first outer reinforcing members 22a, first inner reinforcing members 22b, and second outer reinforcing members 24a may be made of AL 5052.

Further, elements of long side reinforcing members 22 and short side reinforcing members 24, positioned where stress and load are concentrated, and where thermal deformation is minimal (i.e., middle reinforcing member 22c and second inner reinforcing members 24b) are made of a material that is twice or more the rigidity of the material of chassis base 14. For example, middle reinforcing member 22c and second inner reinforcing members 24b may be made of SECC steel. Alternatively, middle reinforcing member 22c may be made of AL 5052 such that only second inner reinforcing members 24b are made of SECC steel.

Table 2 below shows test results of the present invention.

In Sample 3, first outer reinforcing members 22a, first inner reinforcing members 22b, second outer reinforcing members 24a, and middle reinforcing member 22c are made of a material having the same or similar thermal deformation characteristics as the material from which chassis base 14 is made, such as AL 5052, while second inner reinforcing members 24b are made of SECC steel.

TABLE 2

| Sample number | Thermal Deformation (mm) | Bending rigidity (N/mm) |
|---|---|---|
| Sample 3 | 3.5 | 133.5784 |
| Sample 4 | 3.6 | 132.1568 |

In Sample 4, first outer reinforcing members 22a, first inner reinforcing members 22b, and second outer reinforcing members 24a are made of a material having the same or similar thermal deformation characteristics as the material from which chassis base 14 is made, such as AL 5052, and second inner reinforcing members 24b and middle reinforcing member 22c are made using SECC steel.

It is evident from the results shown in Table 2 that by forming some of the elements of reinforcing members 22 and 24 of a material having the same or similar thermal deformation characteristics as chassis base 14, and the remaining elements of reinforcing members 22 and 24 of a material that has a rigidity that is twice or more the rigidity of chassis base 14, thermal deformation of chassis base 14 and damage to chassis base 14 caused by impacts given during packaging and transport are prevented.

This is made possible by the fact that the elements of reinforcing members 22 and 24 where thermal deformation of chassis base 14 is most likely to occur are made of a material having the same or similar thermal deformation characteristics as the material from which chassis base 14 is made, and the elements of reinforcing members 22 and 24 where stress and load are concentrated, and where thermal deformation is minimal, are made of a material that is twice or more the rigidity of the material of chassis base 14.

Although an embodiment of the present invention has been described in detail hereinabove in connection with a certain exemplary embodiment, it should be understood that the invention is not limited to the disclosed exemplary embodiment, but, on the contrary is intended to cover various modifications and/or equivalent arrangements included within the spirit and scope of the present invention, as defined in the appended claims.

What is claimed is:

1. A plasma display device, comprising:
   a chassis base that is substantially rectangular having long sides and short sides, a panel attachment face and a circuit board attachment face;
   a plasma display panel mounted to the panel attachment face of the chassis base;
   at least one plasma display panel drive circuit board mounted to the circuit board attachment face of the chassis base; and
   long side reinforcing members mounted on the circuit attachment face of the chassis base along a long side direction thereof, and short side reinforcing members mounted on the circuit attachment face of the chassis base along a short side direction thereof,
   wherein at least one pair of said short side reinforcing members is made of a first material having a higher rigidity than a second material from which the chassis base is made.

2. The plasma display device of claim 1, wherein the second material is made of aluminum and said first material is made of steel having a rigidity that is twice or more the rigidity of the second material.

3. The plasma display device of claim 1, the short side reinforcing members comprising:
   a pair of outer reinforcing members, each provided along respective ones of short side edges of the chassis base; and
   a pair of inner reinforcing members, each provided inwardly a predetermined distance from respective ones of the outer reinforcing members.

4. The plasma display device of claim 3, wherein the chassis base and said pair of outer reinforcing members are made of aluminum, and said pair of inner reinforcing members are made of steel, which has a rigidity that is twice or more the rigidity of aluminum.

5. The plasma display device of claim 1, the long side reinforcing members comprising:
   a pair of outer reinforcing members, each provided along respective ones of long side edges of the chassis base;
   a pair of inner reinforcing members, each provided inwardly a predetermined distance from respective ones of the outer reinforcing members; and
   a middle reinforcing member provided between the two first inner reinforcing members.

6. The plasma display device of claim 5, wherein the chassis base, said pairs of inner and outer reinforcing members and said middle reinforcing member are made of aluminum.

7. The plasma display device of claim 5, wherein the chassis base and said pairs of inner and outer reinforcing members are made of aluminum, and said middle reinforcing member is made of steel, which has a rigidity that is twice or more the rigidity of aluminum.

8. The plasma display device of claim 2, the long side reinforcing members comprising:
   a pair of first outer reinforcing members, each provided along respective ones of long side edges of the chassis base;
   a pair of first inner reinforcing members, each provided inwardly a predetermined distance from respective ones of the outer reinforcing members; and
   a middle reinforcing member provided between the two first inner reinforcing members.

9. The plasma display device of claim 8, the short side reinforcing members comprising:
   a pair of second outer reinforcing members, each provided along respective ones of short side edges of the chassis base; and
   a pair of second inner reinforcing members, each provided inwardly a predetermined distance from respective ones of the outer reinforcing members.

10. The plasma display device of claim 9, wherein the chassis base and said pair of second outer reinforcing members are made of said second material, and said pair of second inner reinforcing members are made of said first material.

11. The plasma display device of claim 9, wherein the chassis base, said pairs of first inner and first outer reinforcing members and said middle reinforcing member are made of said second material.

12. The plasma display device of claim 9, wherein the chassis base and said pairs of first inner and first outer reinforcing members are made of second material, and said middle reinforcing member is made of said first material.

13. The plasma display device of claim 11, wherein the chassis base and said pair of second outer reinforcing members are made of said second material, and said pair of second inner reinforcing members are made of said first material.

14. The plasma display device of claim 12, wherein the chassis base and said pair of second outer reinforcing members are made of said second material, and said pair of second inner reinforcing members are made of said first material.

15. A chassis base of a plasma display device, the chassis base comprising:
  horizontal sides and vertical sides substantially forming a rectangular chassis base,
  a panel attachment face to which a plasma display panel is mounted;
  a circuit board attachment face to which at least one plasma display panel drive circuit board is mounted;
  first reinforcing members mounted on the circuit attachment face and parallel to the horizontal sides of the chassis base; and
  second reinforcing members mounted on the circuit attachment face and parallel to the vertical sides of the chassis,
  wherein at least one pair of said second reinforcing members is made of a first material having a higher rigidity than a second material from which the chassis base is made and at least two pairs of said first reinforcing members and a remaining pair of second reinforcing members are made of said second material.

16. The chassis base of the plasma display device of claim 15, wherein the second material is made of aluminum and said first material is made of steel having a rigidity that is twice or more the rigidity of the second material.

17. The chassis base of the plasma display device of claim 15, the second reinforcing members comprising:
  a pair of outer reinforcing members, each provided along respective ones of short side edges of the chassis base; and
  a pair of inner reinforcing members, each provided inwardly a predetermined distance from respective ones of the outer reinforcing members.

18. The chassis base of the plasma display device of claim 17, wherein the chassis base and said pair of outer reinforcing members are made of aluminum, and said pair of inner reinforcing members are made of steel, which has a rigidity that is twice or more the rigidity of aluminum.

19. The chassis base of the plasma display device of claim 15, the first reinforcing members comprising:
  a pair of outer reinforcing members, each provided along respective ones of long side edges of the chassis base;
  a pair of inner reinforcing members, each provided inwardly a predetermined distance from respective ones of the outer reinforcing members; and
  a middle reinforcing member provided between the two first inner reinforcing members.

20. The chassis base of the plasma display device of claim 19, wherein the chassis base, said pairs of inner and outer reinforcing members and said middle reinforcing member are made of aluminum.

21. The chassis base of the plasma display device of claim 19, wherein the chassis base and said pairs of inner and outer reinforcing members are made of aluminum, and said middle reinforcing member is made of steel, which has a rigidity that is twice or more the rigidity of aluminum.

* * * * *